(12) United States Patent
Yan

(10) Patent No.: US 9,887,112 B2
(45) Date of Patent: Feb. 6, 2018

(54) INKJET COATING DEVICE AND COATING METHOD

(71) Applicant: SHENZHEN CHINA STAR OPTOELECTRONICS TECHNOLOGY CO., LTD., Shenzhen, Guangdong (CN)

(72) Inventor: Maocheng Yan, Guangdong (CN)

(73) Assignee: SHENZHEN CHINA STAR OPTOELECTRONICS TECHNOLOGY CO., LTD, Shenzhen (CN)

( * ) Notice: Subject to any disclaimer, the term of this patent is extended or adjusted under 35 U.S.C. 154(b) by 0 days.

(21) Appl. No.: 14/440,101

(22) PCT Filed: May 12, 2014

(86) PCT No.: PCT/CN2014/077236
§ 371 (c)(1),
(2) Date: May 1, 2015

(87) PCT Pub. No.: WO2015/149419
PCT Pub. Date: Oct. 8, 2015

(65) Prior Publication Data
US 2017/0011937 A1 Jan. 12, 2017

(30) Foreign Application Priority Data

Apr. 4, 2014 (CN) .......................... 2014 1 0135848

(51) Int. Cl.
*H01L 21/67* (2006.01)
*B05C 5/02* (2006.01)
(Continued)

(52) U.S. Cl.
CPC ............ *H01L 21/6715* (2013.01); *B41J 2/01* (2013.01); *B05B 17/0638* (2013.01);
(Continued)

(58) Field of Classification Search
CPC . H01L 21/6715; H01L 51/0005; H05B 33/10; B41J 2/01; B41J 2/04593;
(Continued)

(56) References Cited

U.S. PATENT DOCUMENTS

| 5,731,821 A * | 3/1998 | Girard ..................... G06T 13/40 345/474 |
| 5,953,027 A | 9/1999 | Suwabe et al. |
| 7,461,913 B2 * | 12/2008 | Kusakari ................ B41J 2/2103 347/19 |
| 7,857,430 B2 * | 12/2010 | Furukawa .............. B41J 2/1433 347/65 |

(Continued)

FOREIGN PATENT DOCUMENTS

| CN | 101352961 A | 1/2009 |
| CN | 103180145 A | 6/2013 |
| CN | 103180146 A | 6/2013 |

OTHER PUBLICATIONS

Chunling Gong, The International Searching Authority written comments, Jan. 2015, CN.

*Primary Examiner* — Laura Edwards

(57) ABSTRACT

An inkjet coating device comprises a support board and a sprinkler head. The support board is provided for placing the glass plate, the sprinkler head comprises a plurality of spray nozzles, wherein, the spray nozzles comprise an ink entrance port and an ink exit port, the ink is poured from the ink entrance port and poured onto the glass plate from the ink exit port, the internal diameter of the ink entrance port is larger than that of the ink exit port. The inkjet coating device comprises a trumpet-shaped spray nozzle which are closed together without gap, so as to not only increase the spraying capacity, but also make the trumpet-shaped ink drop more disperse in each coating interval belt uniformly to form an ink coating layers with uniform thickness.

4 Claims, 2 Drawing Sheets

(51) Int. Cl.
*B41J 2/01* (2006.01)
*B05B 17/06* (2006.01)
*B05B 17/00* (2006.01)
*H01L 51/00* (2006.01)

(52) U.S. Cl.
CPC ....... *B05B 17/0646* (2013.01); *B05B 17/0653* (2013.01); *B05C 5/02* (2013.01); *C03C 2218/119* (2013.01); *H01L 51/0005* (2013.01)

(58) Field of Classification Search
CPC ..... B41J 2/14032; B41J 2/14153; B05B 1/02; B05B 17/0638; B05B 17/0646; B05B 17/0653; B05C 5/02
USPC .................. 347/1, 9, 12, 16, 20, 40; 118/300
See application file for complete search history.

(56) References Cited

U.S. PATENT DOCUMENTS

| | | | |
|---|---|---|---|
| 2007/0190252 A1* | 8/2007 | Iwata | B41M 3/003 427/258 |
| 2009/0027430 A1* | 1/2009 | Miyasaka | B41J 2/04525 347/10 |
| 2009/0085979 A1* | 4/2009 | Onozawa | B41J 2/14201 347/56 |
| 2010/0302518 A1* | 12/2010 | Van Eijk | G03B 27/52 355/30 |
| 2012/0081483 A1* | 4/2012 | Price | B41J 2/19 347/92 |
| 2012/0098887 A1* | 4/2012 | Xie | B41J 2/14016 347/44 |

* cited by examiner

INKJET COATING DEVICE AND COATING METHOD

FIELD OF THE INVENTION

The present invention relates to a manufacture device and method of glass-plate, more especially relates to an inkjet coating device and coating method.

BACKGROUND OF THE INVENTION

Refer to FIG. 1, in the conditional inkjet coating device, the spray nozzle 200 is straight-shaped which are correspondingly toward to the coating interval belt 300 on the glass-plate. The ink is spraying from the spray nozzle to the coating interval belt correspondingly. Because there is gap between the adjoined spray nozzles, the ink is usually remained in the gap on the spraying process. The ink is usually adhered on the spray nozzles to block up it, so that the spray nozzle is not spraying smoothly. The spray nozzle is necessary to be usually cleaned. At the same time, the ink is also often dropping around the coating interval belt and spreading on the adjoined coating interval belt, so as to form an uneven diffusion and different thickness coating interval belt. That is to say, the thickness of the coating interval belt is not easy to be controlled or adjusted.

SUMMARY OF THE INVENTION

For solve the above problem, the present invention is provided for an inkjet coating device and coating method to form an ink coating layers with uniform thickness, with spraying ink uniformly and no-cleaning spray nozzle.

The present invention is provided for an inkjet coating device comprising a support board and a sprinkler head. The support board is provided for placing the glass plate, the sprinkler head comprises a plurality of spray nozzles, wherein, the spray nozzles comprise an ink entrance port and an ink exit port, the ink is poured from the ink entrance port and poured onto the glass plate from the ink exit port, the internal diameter of the ink entrance port is larger than that of the ink exit port.

Preferably, there is not gap between the adjoined spray nozzles, so that the spray nozzles will not be blocked up with the ink adhering on the platform of the spray nozzles and the spray coating will be going on. At the same time, the spray nozzle is like to be a trumpet-shaped and the ink exit port is like to be a saucer shape. The internal diameter of the ink injector nozzle is larger than that of the ink exit port 5-200 μm. The opening angle of the ink exit port is 20-89°. As the spray nozzle is trumpet-shaped, the ink coating surface on the horizontal direction will be enlarged to make ink pour into each coating interval belt uniformly. The ink exit port is like to be a saucer shape so as to prevent the ink remaining on the ink exit port.

Preferably, the inkjet coating device further comprises a piezoelectric sensor which is located above the spray nozzle, the size of the internal diameter of the spray nozzle will be changed to adjust the spraying capacity with the different power produced from the electric voltage changing. The position of the piezoelectric sensor is corresponding to the spray nozzles, and the piezoelectric sensor is selected of a piezoelectric ceramic sensor.

Preferably, a plurality of spacing columns are arranged on the glass plate defining a coating interval belt or empty receptacle formed between each two adjacent spacing columns. Wherein each spray nozzle exit port is configured to spray an ink drop onto the glass plate in coating interval belts in an oblong shape and wherein different colors are formed on each two adjoining coating interval belts by two adjoining sprinkler heads each supplied with a different color ink.

The present invention is provided for an inkjet coating method, wherein comprising:

Step 1) Putting the glass plate on the support board and adjusting the spray nozzle aligning to the glass plate;

Step 2) Spraying out the ink from the spray nozzle, and the ink drop forming to be oblong, and then the ink coating layer will be formed on the coating interval belt.

In step 2), spraying out the ink on the appointed coating interval belt from the appointed spray nozzle, and then achieving the appointed color ink coating layer on the appointed coating interval belt.

Compared to the prior art, the inkjet coating device comprises a trumpet-shaped spray nozzle which are closed together without gap. Using the trumpet-shaped spray nozzle, not only increase the spraying capacity, but also make the trumpet-shaped ink drop more disperse in each coating interval belt uniformly to form an ink coating layers with uniform thickness. Furthermore, as there is no gap between the spray nozzles, so remained ink would not be adhered on the surface of the spray nozzles to block up the spray nozzle, therefore the ink could be sprayed smoothly and the spraying efficiency and quality also will be improved. The procedure on cleaning spray nozzle will be reduced. In addition, the size of the internal diameter of the spray nozzle will be changed to adjust the spraying capacity with the different power produced from the electric voltage changing; the ink spraying capacity will be increased with the internal diameter of the spray nozzle enlarged. As a result, the ink spraying capacity can be micro-adjusted and make the spraying process is more accurate.

DETAILED DESCRIPTION OF THE PREFERRED EMBODIMENTS

Figure 1:
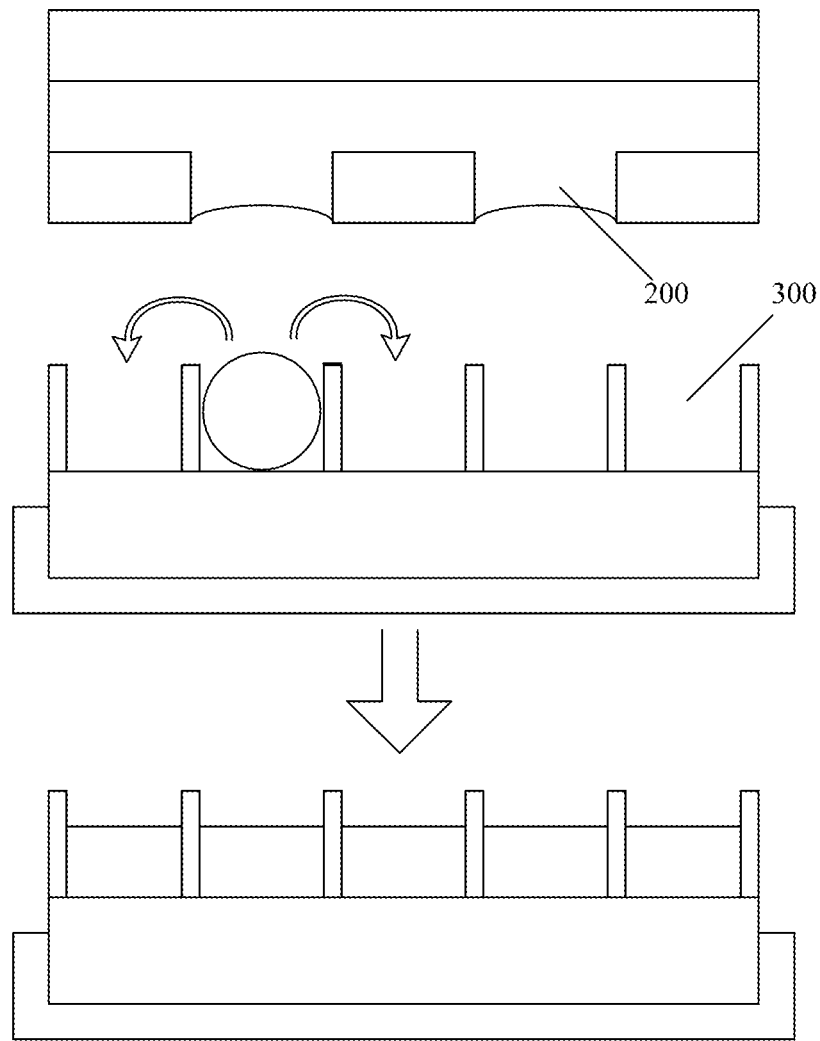
FIG. 1 is a schematic perspective view of the inkjet coating device according to the prior art.
Figure 2:
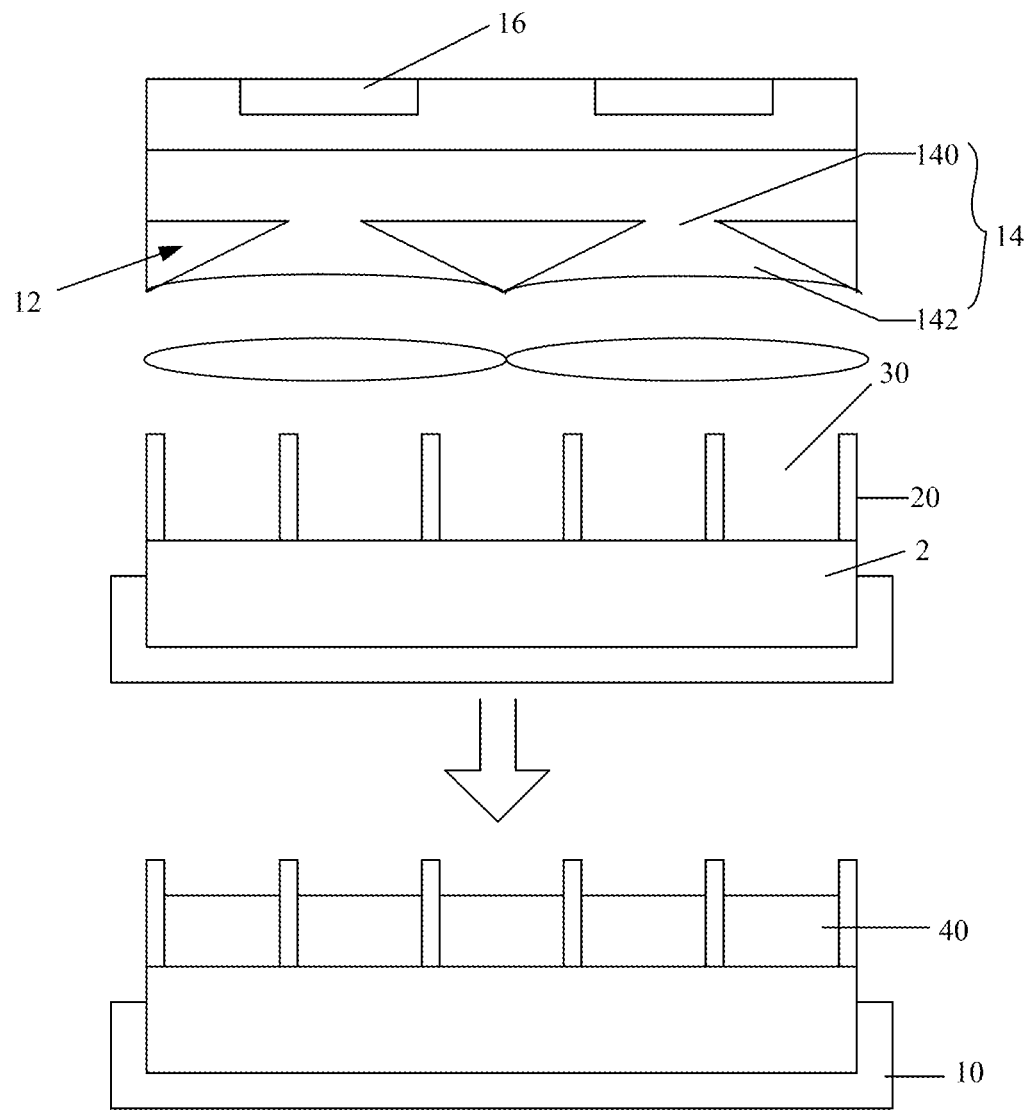
FIG. 2 is a schematic perspective view of the inkjet coating device according to the present invention.

For controlling the ink can be uniformly sprayed on the coating interval belt of the glass-plate with uniform thickness, the present invention is provided for an inkjet coating device 1 comprising a support board 10 and a sprinkler head 12. The support board 10 is provided for placing the glass plate 2. The sprinkler head 12 comprises a plurality of spray nozzles 14. A plurality of spacing columns 20 are arranged on the glass plate 2 and a coating interval belt 30 is mounted between the adjacent spacing columns 20. Wherein, the spray nozzles 14 comprise an ink entrance port 140 and an ink exit port 142, the ink is poured from the ink entrance port 140 and poured onto the glass plate from the ink exit port 142, and the internal diameter of the ink entrance port 140 is larger than that of the ink exit port 142.

Wherein, the plurality of spacing columns 20 are arranged on the glass plate 2 and the coating interval belt 30 is mounted between the adjacent spacing columns 20. The distance between the adjoined coating interval belts 30 are equal. The coating interval belt is provided for filling different color ink. The arrange direction of the coating interval belts 30 is parallel to that of the spray nozzle 14. The ink will be filling in the spacing columns 20 from the spray nozzles 14. Different color ink will be filled into at least one group coating interval belts 20. The ink is alignment film ink.

The sprinkler head 12 comprises a plurality of spray nozzles 14 in parallel, which is mounted below the support board 10. The spray nozzles 14 are opposite to the coating interval belts 30 of the glass plate 2. In the prefer embodiment of the present invention, with no gap between the adjoined spray nozzles 14, the ink will be avoided adhering on the surface of the spray nozzles 14 to block the spray nozzles 14, so as to keep the ink coating continuously. On owing to the remaining ink no adhering on the spray nozzles 14, so the spray nozzles 14 are not have to be cleaned on the coating process. Therefore, the coating process can be simplified and the produce efficiency and the capacity can be also improved significantly. In addition, the ink would not be leaking on the surface of the spray nozzles, so as to improve the quality of the glass plate.

At the same time, the spray nozzle 14 is trumpet-shaped. The internal diameter of the ink injector nozzle is larger than that of the ink exit port 5-200 μm, prefer to 100-150 μm. The opening angle of the ink exit port is 20-89°, prefer to 30-60°. The ink capacity will be increased and the ink drop is oblong-shape from the trumpet-shaped spray nozzles 14, as a result, the superficial area of the ink on the horizontal direction will be enlarged to be uniformity poured into each the coating interval belt 30 to form several ink coating layers with uniform thickness. The ink can be filled into the coating interval belts 30 to form an ink coating layer 40 covering the surface of the glass plate with a thin film mixed together. The ink exit port 142 is like to be a saucer shape, so as to prevent the ink remaining on the surface of the ink exit port 142. It is no necessary to arrange the same number of the spray nozzles 14 with the coating interval belts 30, so the number of the spray nozzles can be reduced.

In the prefer embodiment, the inkjet coating device further comprises a piezoelectric sensor 16 which is mounted on the spray nozzle 14, the size of the internal diameter of the spray nozzle 14 will be changed on the different power produced from the electric voltage changing. The position of the piezoelectric sensor 16 is corresponding to the spray nozzle 14. The piezoelectric sensor 16 is selected of a piezoelectric ceramic sensor. The electromagnetic field can be produced with the piezoelectric sensor 16 electrifying. Under the action of the applied electric field, the spray nozzle will be deformed. The shape and the internal diameter of the spray nozzle 14 will be deformed with the voltage changing. With the voltage strengthening, the force on the spray nozzle 14 also will be enlarged, and then the internal diameter of the spray nozzle 14 also will be enlarged, and then the capacity of the spraying ink also will be increased. That is to say, the capacity of the spraying ink is in direct proportion to the voltage.

A color filter, TFT plate or OLED plate can be sandwiched between the coating interval belt 30.

The present invention is provided for an inkjet coating method, wherein comprising:

Step 1) Putting the glass plate on the support board and adjusting the spray nozzle aligning to the glass plate;

Step 2) Spraying out the ink from the spray nozzle, and the ink drop forming to be oblong, and then the ink coating layer will be formed on the coating interval belt.

In step 2), spraying out the ink on the appointed coating interval belt from the appointed spray nozzle, and then achieving the appointed color ink coating layer on the appointed coating interval belt. Therefore, the ink coating layer with uniform coating can be achieved according to the about method.

The inkjet coating device comprises a trumpet-shaped spray nozzle which are closed together without gap. Using the trumpet-shaped spray nozzle, not only increase the spraying capacity, but also make the ink drop more disperse in each coating interval belt uniformly to form an ink coating layers with uniform thickness. Furthermore, there is no gap between the spray nozzles, so remained ink would not be adhered on the surface of the spray nozzles to block up the spray nozzle, therefore the ink could be sprayed smoothly and the spraying efficiency and quality also will be improved. The procedure on cleaning spray nozzle will be reduced. In addition, the size of the internal diameter of the spray nozzle will be changed to adjust the spraying capacity with the different power produced from the electric voltage changing; the ink spraying capacity will be increased with the internal diameter of the spray nozzle enlarged. As a result, the ink spraying capacity can be micro-adjusted and make the spraying process is more accurate.

What is claimed is:

1. An inkjet coating device, comprising a support board and a sprinkler head, the support board is provided for placing a glass plate, the sprinkler head comprises a plurality of spray nozzles, wherein, the spray nozzles comprise an ink entrance port and an ink exit port, the ink is poured firm the ink entrance port and poured onto the glass plate from the ink exit port, an internal diameter of each spray nozzle is larger than that of the ink exit port, and there is no gap between each two adjoining sprinkler heads, wherein each spray nozzle is trumpet shaped and each ink exit port is saucer shaped, wherein the inkjet coating device further comprises a piezoelectric sensor which is located above each spray nozzle, a size of an internal diameter of each spray nozzle will be changed to adjust spraying capacity based on different power produced from electric voltage changing by electric voltage changing through the piezoelectric sensor, wherein a plurality of spacing columns are arranged on the glass plate defining a coating interval belt or empty receptacle formed between each two adjoining spacing columns, wherein each spray nozzle exit port is configured to spray an ink drop onto the glass plate in coating interval belts in an oblong shape and wherein different colors are formed on each two adjoining coating interval belts by two adjoining sprinkler heads each supplied with a different color ink.

2. The inkjet coating device according to claim 1, wherein a position of the piezoelectric sensor is corresponding to each spray nozzle, the piezoelectric sensor is a piezoelectric ceramic sensor.

3. The inkjet coating device according to claim 1, wherein the internal diameter of each spray nozzle is larger than that of the ink exit port by 5-200 μm, and an opening angle of the ink exit port is 20-89°.

4. The inkjet coating device according to claim 1, wherein the ink exit port is configured to spray an ink drop in an oblong shape.

* * * * *